(12) United States Patent
Nomura et al.

(10) Patent No.: US 9,761,732 B2
(45) Date of Patent: Sep. 12, 2017

(54) TUNNEL THIN FILM TRANSISTOR WITH HETERO-JUNCTION STRUCTURE

(71) Applicant: SnapTrack, Inc., San Diego, CA (US)

(72) Inventors: Kenji Nomura, San Jose, CA (US); John Hyunchul Hong, San Clemente, CA (US)

(73) Assignee: SnapTrack Inc., San Diego, CA (US)

( * ) Notice: Subject to any disclaimer, the term of this patent is extended or adjusted under 35 U.S.C. 154(b) by 123 days.

(21) Appl. No.: 14/631,667

(22) Filed: Feb. 25, 2015

(65) Prior Publication Data

US 2016/0247927 A1    Aug. 25, 2016

(51) Int. Cl.
| | |
|---|---|
| *H01L 29/786* | (2006.01) |
| *H01L 29/08* | (2006.01) |
| *H01L 29/78* | (2006.01) |
| *H01L 29/24* | (2006.01) |
| *H01L 29/267* | (2006.01) |
| *H01L 29/66* | (2006.01) |
| *H01L 21/02* | (2006.01) |
| *G09G 3/20* | (2006.01) |
| *H01L 29/739* | (2006.01) |
| *G09G 3/34* | (2006.01) |

(52) U.S. Cl.
CPC ......... *H01L 29/7869* (2013.01); *G09G 3/20* (2013.01); *H01L 21/0262* (2013.01); *H01L 21/02554* (2013.01); *H01L 21/02565* (2013.01); *H01L 29/0843* (2013.01); *H01L 29/0895* (2013.01); *H01L 29/24* (2013.01); *H01L 29/267* (2013.01); *H01L 29/66969* (2013.01); *H01L 29/7391* (2013.01); *H01L 29/7848* (2013.01); *H01L 29/78618* (2013.01); *H01L 29/78693* (2013.01); *H01L 29/78696* (2013.01); *G09G 3/3466* (2013.01); *G09G 2300/08* (2013.01)

(58) Field of Classification Search
CPC combination set(s) only.
See application file for complete search history.

(56) References Cited

U.S. PATENT DOCUMENTS

| | | | |
|---|---|---|---|
| 4,065,781 | A | 12/1977 | Gutknecht |
| 8,063,421 | B2 | 11/2011 | Kang et al. |
| 8,581,245 | B2 | 11/2013 | Taniguchi |
| 8,766,250 | B2 | 7/2014 | Miyanaga et al. |

(Continued)

OTHER PUBLICATIONS

International Search Report and Written Opinion—PCT/US2016/015789—ISA/EPO—dated Apr. 22, 2016.

*Primary Examiner* — Kyoung Lee
*Assistant Examiner* — Ratisha Mehta
(74) *Attorney, Agent, or Firm* — Weaver Austin Villeneuve & Sampson LLP-QUAL

(57) ABSTRACT

This disclosure provides thin film transistors (TFTs) including p-n hetero-junction structures. A p-n hetero-junction structure may include a junction between a narrow bandgap material and a wide bandgap material. The narrow bandgap material, which may be an oxide, nitride, selenide, or sulfide, is the active channel material of the TFT and may provide relatively high carrier mobility. The hetero-junction structures facilitate band-to-band tunneling and suppression of TFT off-currents. In various implementations, the TFTs may be formed on flexible substrates and have low temperature processing capabilities.

30 Claims, 15 Drawing Sheets

(56) References Cited

U.S. PATENT DOCUMENTS

| | | |
|---|---|---|
| 8,841,673 B2 | 9/2014 | Kanegae et al. |
| 2009/0321731 A1* | 12/2009 | Jeong ................... H01L 29/4908 |
| | | 257/43 |
| 2011/0127510 A1* | 6/2011 | Seo ..................... H01L 51/0052 |
| | | 257/40 |
| 2012/0302016 A1 | 11/2012 | Ma |
| 2013/0221343 A1 | 8/2013 | Son et al. |
| 2013/0249026 A1* | 9/2013 | Kitagawa ................ H01L 43/08 |
| | | 257/421 |
| 2013/0307857 A1* | 11/2013 | Aflatooni ............. G02B 26/001 |
| | | 345/501 |
| 2014/0117349 A1* | 5/2014 | Wenxu .............. H01L 21/02595 |
| | | 257/43 |
| 2014/0139772 A1* | 5/2014 | Kim ................... H01L 27/3258 |
| | | 349/43 |
| 2014/0152936 A1* | 6/2014 | Kim ................... H01L 29/7869 |
| | | 349/43 |

* cited by examiner

TUNNEL THIN FILM TRANSISTOR WITH HETERO-JUNCTION STRUCTURE

TECHNICAL FIELD

This disclosure relates to thin film transistors and more particularly to thin film transistors having oxide, sulfide, selenide, or nitride channels.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of optical interference. In some implementations, an IMOD display element may include a pair of conductive plates, one or both of which may be transparent and/or reflective, wholly or in part, and capable of relative motion upon application of an appropriate electrical signal. For example, one plate may include a stationary layer deposited over, on or supported by a substrate and the other plate may include a reflective membrane separated from the stationary layer by an air gap. The position of one plate in relation to another can change the optical interference of light incident on the IMOD display element. IMOD-based display devices have a wide range of applications, and are anticipated to be used in improving existing products and creating new products, especially those with display capabilities.

Hardware and data processing apparatus may be associated with electromechanical systems. Such hardware and data processing apparatus may include thin film transistors (TFTs). A TFT is a transistor that includes thin films of metal and semiconductor layers.

SUMMARY

The systems, methods and devices of this disclosure each have several innovative aspects, no single one of which is solely responsible for the desirable attributes disclosed herein.

One innovative aspect of the subject matter described in this disclosure can be implemented in an apparatus including a thin film transistor (TFT), with the TFT having a source electrode, a drain electrode; a first semiconductor layer connecting the source electrode and the drain electrode, the first semiconductor layer including a source region, a channel region, and a drain region; and a source-side p-n hetero-junction between the source electrode and the source region of the first semiconductor layer, where the first semiconductor layer includes an oxide, sulfide, selenide, or nitride semiconductor material. The source-side p-n hetero-junction may be formed from the first semiconductor layer and a second semiconductor layer disposed between the semiconductor layer and the source electrode, where the second semiconductor layer including an oxide, sulfide, selenide or nitride semiconductor material.

In some implementations, the p-n heterojunction includes a narrow bandgap material and a wide bandgap material, the semiconductor layer including the narrow bandgap material. According to various implementations, the narrow bandgap material may have a bandgap of 1.0 eV or less and the wide bandgap material may have a bandgap of 3.0 eV or greater.

The p-n heterojunction may be formed from a p-type oxide including one of undoped or doped SnO, Ag2O, Cu2O, or NiO and an n-type oxide including one of doped or undoped ZnO, SnO2, In2O3, TiO2 or IGZO-related materials.

In some implementations, the thickness of the first semiconductor layer is between about 2 nm and 40 nm. In some implementations, the p-n hetero-junction includes a p-type semiconductor and an n-type semiconductor, which have carrier densities of at least $10^{18}$/cm3. In some implementations, the p-n hetero-junction includes a p-type semiconductor and an n-type semiconductor, which have carrier densities of at least $10^{19}$/cm3. The TFT may be a p-channel or n-channel TFT.

In some implementations, the source-side p-n hetero-junction is formed from the first semiconductor layer and a second semiconductor layer disposed between the semiconductor layer and the source electrode, the second semiconductor layer including an oxide, sulfide, selenide, or nitride semiconductor material. In some implementations, the thickness of the first semiconductor layer is between about 2 nm and 100 nm.

In some implementations, the TFT exhibits tunneling across a potential barrier at the p-n hetero-junction. In some implementations, the TFT has an off-current of no more than 10 picoamperes.

In some implementations, the first semiconductor layer may be amorphous or nanocrystalline. The apparatus may further include a flexible substrate on which the TFT is disposed. In some implementations, the TFT is part of a complementary metal-oxide-semiconductor (CMOS) TFT device. The TFT may include one or both of a bottom gate and a top gate.

In some implementations, the apparatus further includes a display, a processor that is configured to communicate with the display, the processor being configured to process image data, and a memory device that is configured to communicate with the processor. The apparatus may further include a driver circuit configured to send at least one signal to the display; and a controller configured to send at least a portion of the image data to the driver circuit. The driver circuitry may include the TFT in some implementations. In some implementations, an image source module configured to send the image data to the processor, wherein the image source module includes at least one of a receiver, transceiver, and transmitter. The apparatus may further include an input device configured to receive input data and to communicate the input data to the processor.

Another innovative aspect of the subject matter described in this disclosure can be implemented in an apparatus including a drain electrode, a source electrode, and semiconductor means to electrically connect the drain electrode and the source electrode. In some implementations, the semiconductor means include a p-n hetero-junction. The apparatus may further include a gate electrode and a gate dielectric.

Another innovative aspect of the subject matter described in this disclosure can be implemented in a method including providing a substrate, forming a first semiconductor layer on the substrate, where the first semiconductor layer includes an oxide, sulfide, selenide, or nitride semiconductor material and where the first semiconductor layer includes a source region, a drain region, and a channel region, forming a second semiconductor layer on the source region of the first semiconductor layer to thereby form a source-side p-n heterojunction, and forming a source electrode on the second semiconductor layer and a drain electrode on the drain region of the first semiconductor layer. Forming the first semiconductor layer may include an atomic layer deposition (ALD) process in some implementations. In some implementations, the method may further include forming a gate electrode and a gate dielectric, wherein the gate dielectric is between the first semiconductor layer and the gate electrode.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays, organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
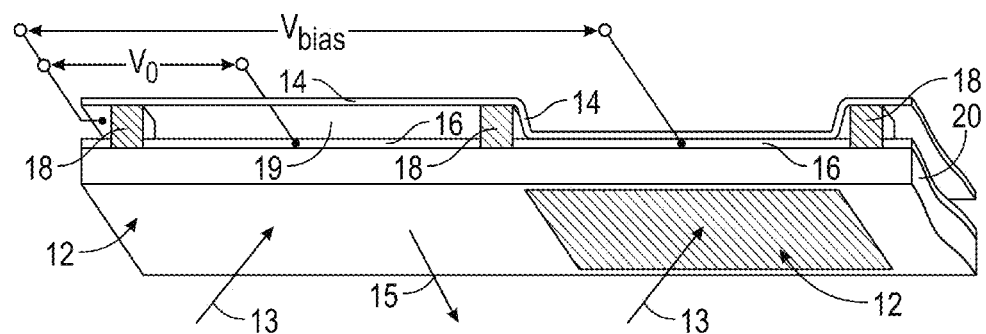
FIG. 1 is an isometric view illustration depicting two adjacent interferometric modulator (IMOD) display elements in a series or array of display elements of an IMOD display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Implementations described herein relate to thin film transistors (TFTs) including p-n hetero-junction structures. A p-n hetero-junction structure may include a junction between a narrow bandgap material and a wide bandgap material. The narrow bandgap material, which may be an oxide, nitride, or sulfide, is the active channel material of the TFT and may provide relatively high carrier mobility. The hetero-junction structure facilitates band-to-band tunneling and the suppression of the TFT off-current. Large conduction and valence band discontinuities may reduce the effective tunneling barrier and enhance the probability of tunneling. The TFTs described herein include p-type channel TFTs and n-type channel TFTs.

The TFTs may include a source electrode, a drain electrode, and a first semiconductor layer connecting the source and drain electrodes. A second semiconductor layer may be disposed between a source region of the first semiconductor layer and the source electrode to form a p-n hetero-junction. One of the first semiconductor layer and the second semiconductor layer is a p-type semiconductor with the other layer being an n-type semiconductor.

Particular implementations of the subject matter described in this disclosure can be implemented to realize one or more of the following potential advantages. A TFT including a p-n hetero-junction structure may provide good TFT characteristics including high mobility and low off-current. A TFT including an oxide, sulfide, or nitride channel and a p-n hetero-junction structure may have low temperature processing capability and may be implemented on a flexible substrate. A TFT including a p-n hetero-junction structure may be implemented in a complementary metal-oxide-semiconductor (CMOS) TFT circuit. Such TFT circuits may be integrated on a display backplate, for example as driver circuits, or in other electronic devices. This reduces manufacturing cost and failures associated with separately packaged integrated circuit (IC) drivers.

An example of a suitable EMS or MEMS device or apparatus, to which the described implementations of the TFT may apply, is a reflective display device. Reflective display devices can incorporate interferometric modulator (IMOD) display elements that can be implemented to selectively absorb and/or reflect light incident thereon using principles of optical interference. IMOD display elements can include a partial optical absorber, a reflector that is movable with respect to the absorber, and an optical resonant cavity defined between the absorber and the reflector. In some implementations, the reflector can be moved to two or more different positions, which can change the size of the optical resonant cavity and thereby affect the reflectance of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber.

FIG. 1 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 1 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 1, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex®, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 1 and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 μm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 1, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 1. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
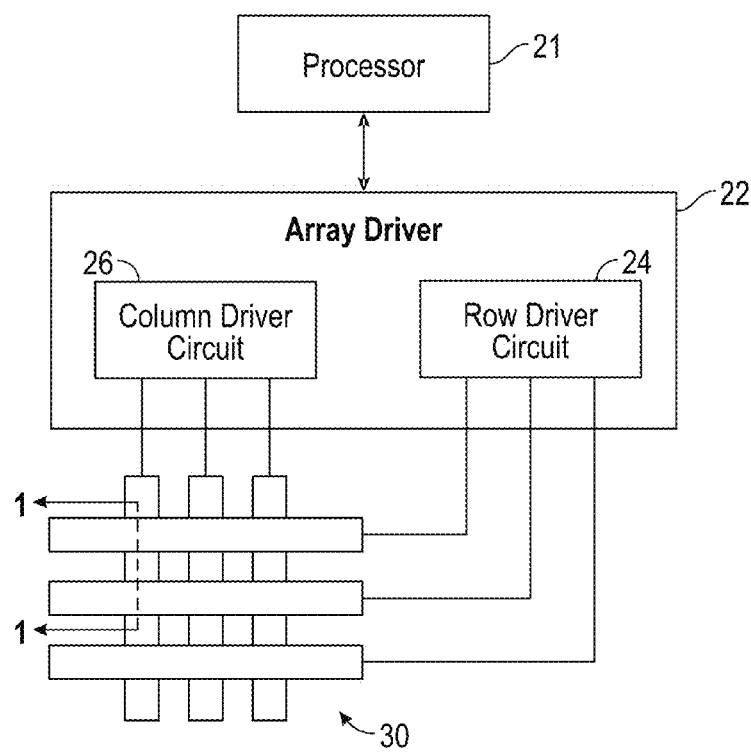
FIG. 2 is a system block diagram illustrating an electronic device incorporating an IMOD-based display including a three element by three element array of IMOD display elements.

FIG. 2 is a system block diagram illustrating an electronic device incorporating an IMOD-based display including a three element by three element array of IMOD display elements. Such an electronic device may include implementations of the TFTs disclosed herein. For example, a complementary metal-oxide-semiconductor (CMOS) TFT device may be used as part of a driving circuit, for example, of the electronic device illustrated in FIG. 2. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 1 is shown by the lines 1-1 in FIG. 2. Although FIG. 2 illustrates a 3×3 array of IMOD display elements for the sake of clarity, the display array 30 may contain a very large number of IMOD display elements, and may have a different number of IMOD display elements in rows than in columns, and vice versa.

Figure 3A:
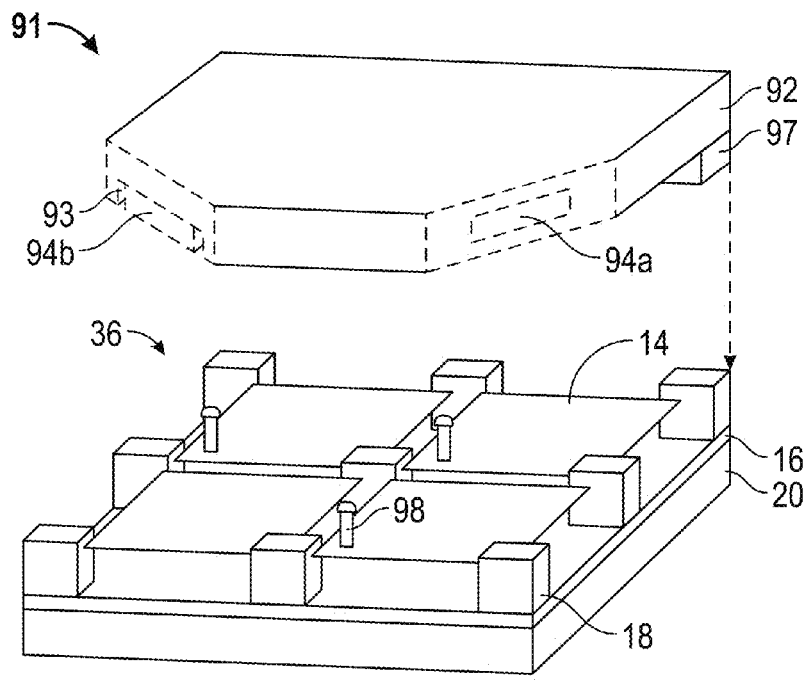
FIGS. 3A and 3B are schematic exploded partial perspective views of a portion of an electromechanical systems (EMS) package including an array of EMS elements and a backplate.
Figure 3B:
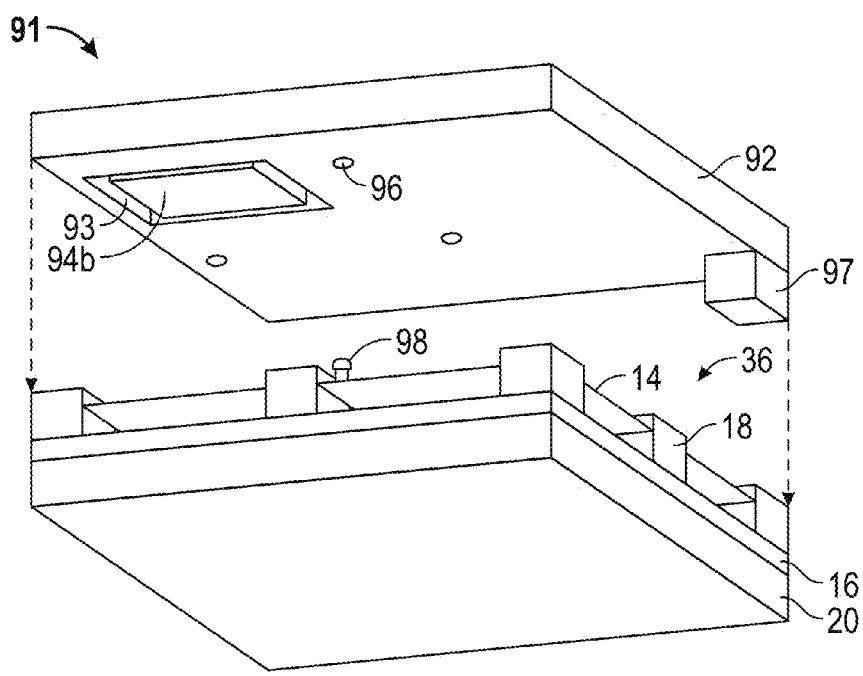

FIGS. 3A and 3B are schematic exploded partial perspective views of a portion of an EMS package 91 including an array 36 of EMS elements and a backplate 92. A TFT as disclosed herein may be implemented in the EMS package 91 shown in FIGS. 3A and 3B. For example, a TFT including a p-n hetero-junction structure may be implemented in a driver circuit on the backplate 92. FIG. 3A is shown with two corners of the backplate 92 cut away to better illustrate certain portions of the backplate 92, while FIG. 3B is shown without the corners cut away. The EMS array 36 can include a substrate 20, support posts 18, and a movable layer 14. In some implementations, the EMS array 36 can include an array of IMOD display elements with one or more optical stack portions 16 on a transparent substrate, and the movable layer 14 can be implemented as a movable reflective layer.

The backplate 92 can be essentially planar or can have at least one contoured surface (e.g., the backplate 92 can be formed with recesses and/or protrusions). The backplate 92 may be made of any suitable material, whether transparent or opaque, conductive or insulating. Suitable materials for the backplate 92 include, but are not limited to, glass, plastic, ceramics, polymers, laminates, metals, metal foils, Kovar and plated Kovar.

As shown in FIGS. 3A and 3B, the backplate 92 can include one or more backplate components 94a and 94b, which can be partially or wholly embedded in the backplate 92. As can be seen in FIG. 3A, backplate component 94a is embedded in the backplate 92. As can be seen in FIGS. 3A and 3B, backplate component 94b is disposed within a recess 93 formed in a surface of the backplate 92. In some implementations, the backplate components 94a and/or 94b can protrude from a surface of the backplate 92. Although backplate component 94b is disposed on the side of the backplate 92 facing the substrate 20, in other implementations, the backplate components can be disposed on the opposite side of the backplate 92.

The backplate components 94a and/or 94b can include one or more active or passive electrical components, such as transistors, capacitors, inductors, resistors, diodes, switches, and/or integrated circuits (ICs) such as a packaged, standard or discrete IC. Other examples of backplate components that can be used in various implementations include antennas, batteries, and sensors such as electrical, touch, optical, or chemical sensors, or thin-film deposited devices.

In some implementations, the backplate components 94a and/or 94b can be in electrical communication with portions of the EMS array 36. Conductive structures such as traces, bumps, posts, or vias may be formed on one or both of the backplate 92 or the substrate 20 and may contact one another or other conductive components to form electrical connections between the EMS array 36 and the backplate components 94a and/or 94b. For example, FIG. 3B includes one or more conductive vias 96 on the backplate 92 which can be aligned with electrical contacts 98 extending upward from the movable layers 14 within the EMS array 36. In some implementations, the backplate 92 also can include one or more insulating layers that electrically insulate the backplate components 94a and/or 94b from other components of the EMS array 36. In some implementations in which the backplate 92 is formed from vapor-permeable materials, an interior surface of backplate 92 can be coated with a vapor barrier (not shown).

The backplate components 94a and 94b can include one or more desiccants which act to absorb any moisture that may enter the EMS package 91. In some implementations, a desiccant (or other moisture absorbing materials, such as a getter) may be provided separately from any other backplate components, for example as a sheet that is mounted to the backplate 92 (or in a recess formed therein) with adhesive. Alternatively, the desiccant may be integrated into the backplate 92. In some other implementations, the desiccant may be applied directly or indirectly over other backplate components, for example by spray-coating, screen printing, or any other suitable method.

In some implementations, the EMS array 36 and/or the backplate 92 can include mechanical standoffs 97 to maintain a distance between the backplate components and the display elements and thereby prevent mechanical interference between those components. In the implementation illustrated in FIGS. 3A and 3B, the mechanical standoffs 97 are formed as posts protruding from the backplate 92 in alignment with the support posts 18 of the EMS array 36. Alternatively or in addition, mechanical standoffs, such as rails or posts, can be provided along the edges of the EMS package 91.

Although not illustrated in FIGS. 3A and 3B, a seal can be provided which partially or completely encircles the EMS array 36. Together with the backplate 92 and the substrate 20, the seal can form a protective cavity enclosing the EMS array 36. The seal may be a semi-hermetic seal, such as a conventional epoxy-based adhesive. In some other implementations, the seal may be a hermetic seal, such as a thin film metal weld or a glass frit. In some other implementations, the seal may include polyisobutylene (PIB), polyurethane, liquid spin-on glass, solder, polymers, plastics, or other materials. In some implementations, a reinforced sealant can be used to form mechanical standoffs.

In alternate implementations, a seal ring may include an extension of either one or both of the backplate 92 or the substrate 20. For example, the seal ring may include a mechanical extension (not shown) of the backplate 92. In some implementations, the seal ring may include a separate member, such as an O-ring or other annular member.

In some implementations, the EMS array 36 and the backplate 92 are separately formed before being attached or coupled together. For example, the edge of the substrate 20 can be attached and sealed to the edge of the backplate 92 as discussed above. Alternatively, the EMS array 36 and the backplate 92 can be formed and joined together as the EMS package 91. In some other implementations, the EMS package 91 can be fabricated in any other suitable manner, such as by forming components of the backplate 92 over the EMS array 36 by deposition.

Hardware and data processing apparatus may be associated with EMS structures. Such hardware and data processing apparatus may include a transistor switch, such as a thin film transistor (TFT). EMS display elements in a display device may be arranged in an array such as a two-dimensional grid and addressed by circuits associated with the rows and columns of the array. Row driver circuits may drive the gates of transistor switches that select a particular row to be addressed, and common driver circuits may provide a bias to a given row of display elements that may be synchronously updated with a row refresh.

A display device can include an array of display elements, which can be referred to as pixels. Some displays can include hundreds, thousands, or millions of pixels arranged in hundreds or thousands of rows and hundreds and thousands of columns. Each pixel can be driven by one or more TFTs. A TFT is a type of field-effect transistor made by depositing thin films of a semiconductor layer as well as one or more dielectric layers and conductive layers over a substrate. With increasing developments in flat panel displays, systems-on-glass, display devices, mobile devices, wearable devices, and the like, there is a growing demand for high performance TFTs.

Integrating switching matrices with driver circuits on a display backplate, as well as in other electronic devices, reduces manufacturing cost and failures associated with separately packaged IC drivers. Complementary metal-oxide-semiconductor (CMOS) circuits use n-type and p-type channels. Disclosed herein are high performance TFTs having low leakage current and relatively high mobilities. Also disclosed are circuits including n-type and p-type TFTs as well as electronic devices, such as display devices, that include such circuits.

Figure 4A:
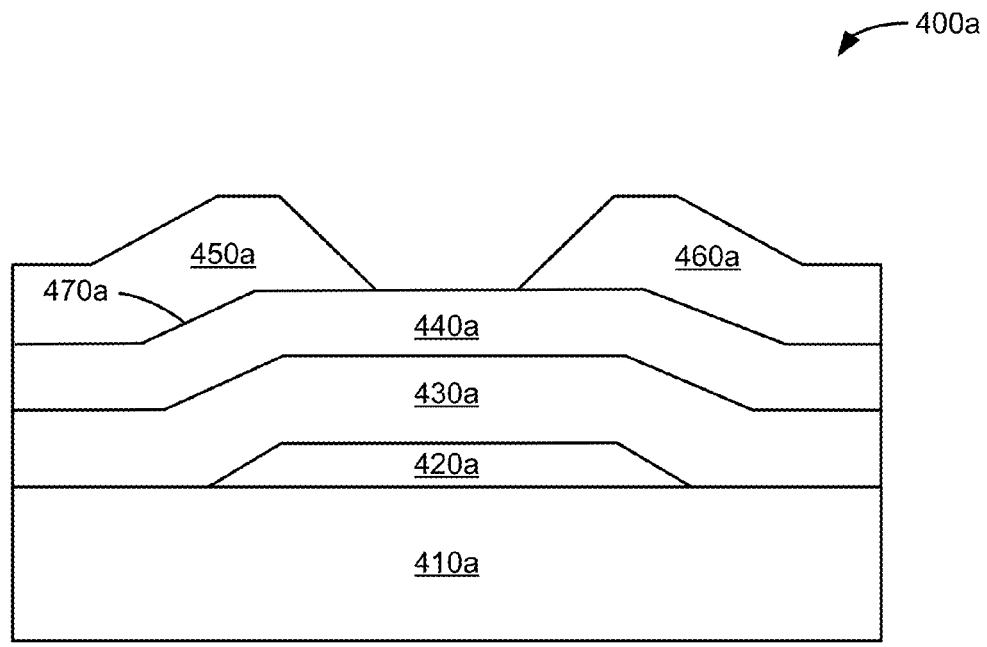
FIG. 4A is an example of a cross-sectional diagram illustrating a bottom gate thin film transistor (TFT) according to some implementations.

Generally, a TFT can include a semiconductor layer with a source region, a drain region, and a channel region in the semiconductor layer. As such, a TFT can be a three-terminal device that includes a source terminal, a drain terminal, and a gate terminal for modulating the conductivity of a channel. Some types of TFTs can be defined in terms of the location of the gate terminal. For example, types of TFT geometries can include a bottom gate geometry, a top gate geometry, or a dual gate geometry. FIG. 4A is an example of a cross-sectional diagram illustrating a bottom gate TFT according to some implementations. In FIG. 4A, a bottom gate TFT 400a includes a substrate 410a, a gate electrode 420a over the substrate 410a, a gate dielectric 430a over the gate electrode 420a, a semiconductor layer 440a over the gate dielectric 430a, a source electrode 450a over a source region of the semiconductor layer 440a, and a drain electrode 460a over a drain region of the semiconductor layer 440a, where a channel region in the semiconductor layer 440a is between the source region and the drain region. The semiconductor layer 440a electrically connects the source electrode 450a and the drain electrode 460a, with conductivity in the channel region a function of the potential applied across the gate electrode 420a and the source electrode 450a. As described further below, in some implementations, the bottom gate TFT includes a p-n hetero-junction at the interface 470a of the source electrode 450a and the semiconductor layer 440a.

Figure 4B:
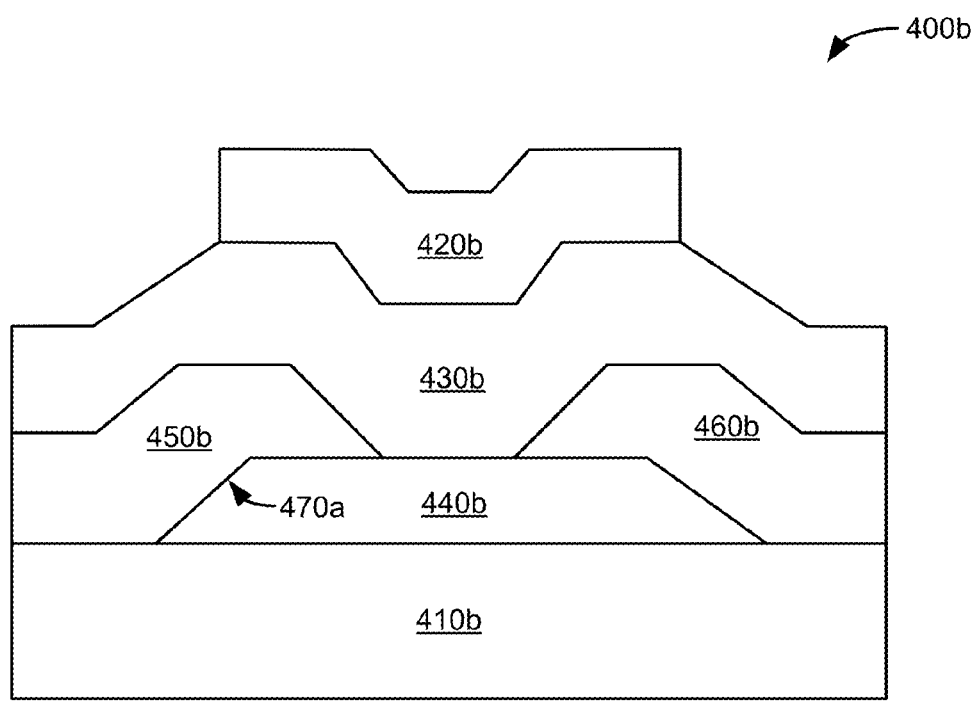
FIG. 4B is an example of a cross-sectional diagram illustrating a top gate TFT according to some implementations.

FIG. 4B is an example of a cross-sectional diagram illustrating a top gate TFT according to some implementations. In FIG. 4B, a top gate TFT 400b includes a substrate 410b, a semiconductor layer 440b over the substrate 410b, a source electrode 450b over a source region of the semiconductor layer 440b, a drain electrode 460b over a drain region of the semiconductor layer 440b, a gate dielectric 430b over the source electrode 450b, and a gate electrode 420b over the gate dielectric 430b, where a channel region is between the source region and the drain region of the semiconductor layer 440b. The semiconductor layer 440b electrically connects the source electrode 450b and the drain electrode 460b, with conductivity in the channel a function of the potential applied across the gate electrode 420b and the source electrode 450b. As described further below, in some implementations, the bottom gate TFT includes a p-n hetero-junction at the interface 470b source electrode 450b and the semiconductor layer 440b.

The gate electrodes 420a and 420b may include one or more metals or other conductive materials. Examples of metals include aluminum (Al), copper (Cu), molybdenum (Mo), tantalum (Ta), chromium (Cr), neodymium (Nd), tungsten (W), titanium (Ti), gold (Au), nickel (Ni), and alloys containing any of these elements. In some implementations, each of the gate electrodes 420a and 420b can include two or more layers of different metals arranged in a stacked structure. In some implementations, each of the gate electrodes 420 can have a thickness between about 50 nm and about 500 nm, or between about 100 nm and about 250 nm.

The source electrodes 450a and 450b and the drain electrodes 460a and 460b may include any number of different metals or other conductive materials. Examples of metals include Mo, W, Au, platinum (Pt), silver (Ag), magnesium (Mg), manganese (Mn), tin (Sn), Ti, Al, Cu, Ta, Cr, Nd, Ni, and alloys containing any of these elements. For example, the source electrodes 450a and 450b and the drain electrodes 460a and 460b may include a stable contact metal such as Mo, W, Au, Pt, and Ag. In some implementations, each of the source electrodes 450a and 450b and the drain electrodes 460a and 460b includes two or more sub-layers of different metals arranged in a stacked structure. In some implementations, each of the source electrodes 450a and 450b and the drain electrodes 460a and 460b can have a thickness between about 50 nm and about 500 nm, or between about 100 nm and about 250 nm.

The gate dielectrics 430a and 430b may also be referred to as gate insulators. Each of the gate dielectrics 430a and 430b may include any number of different dielectric materials, including silicon dioxide ($SiO_2$), aluminum oxide ($Al_2O_3$), hafnium oxide ($HfO_2$), yttrium oxide ($Y_2O_3$), titanium oxide ($TiO_2$), silicon oxynitride (SiON), silicon nitride (SiN), or organic dielectric materials. In some implementations, each of the gate dielectrics 430a and 430b can include two or more layers of dielectric materials arranged in a stacked structure. In some implementations, a thickness of a gate dielectric layer can be between about 50 nm and about 500 nm, or between about 100 nm and about 250 nm.

In FIGS. 4A and 4B, the bottom gate TFT 400a and the top gate TFT 400b can include metal oxide TFTs, where the semiconductor layers 440a and 440b can include a metal oxide, metal nitride, or metal sulfide. In a metal oxide TFT, a metal oxide semiconductor is deposited as an active channel layer in the TFT. Similarly, in a metal nitride TFT, a metal nitride semiconductor is deposited as an active channel layer and in a metal sulfide TFT, a metal sulfide semiconductor is deposited as an active channel layer.

According to various implementations, the bottom gate TFT 400a and the top gate TFT 400b can be p-channel or n-channel TFTs. As described further below, in some implementations, the TFTs disclosed herein can include a p-n hetero-junction on the source-side. For a p-channel TFT, a p-type semiconductor is deposited as an active channel layer, with an n-type semiconductor disposed between the source electrode and the p-type semiconductor. For an n-channel TFT, an n-type semiconductor is deposited as an active channel layer, with a p-type semiconductor disposed between the source electrode and the n-type semiconductor. The TFTs disclosed herein also include dual gate TFTs.

TFTs may be characterized by one or more of carrier mobility (μ), threshold voltage ($V_{th}$), off-current ($I_{OFF}$), on/off current ratio ($I_{ON}/I_{OFF}$), subthreshold slope, and s-value. Mobility characterizes how a carrier (hole or electron) moves through a semiconductor in the presence of an electric field, and is defined as $\mu = v_d/E$, where $v_d$ is the drift velocity of the electrons and E is the electric field. Mobility may be determined by Hall effect measurements (and reported as Hall mobility) or extracted from TFT performance measurements (and reported as field effect mobility). For example, the carrier mobility may be extracted from experimental measurements of the drain current ($I_d$) and gate bias ($V_g$). Field effect mobility can be determined from saturation-mode or linear-region measurements. A TFT may also be characterized by threshold voltage ($V_{th}$), the minimum gate-to-source voltage differential that creates a conducting path between the source and drain, and on/off current ratio, with high on/off current ratios desirable. The TFT may be characterized by the subthreshold slope, which is a measure of the switching behavior of the TFT; a steep subthreshold slope indicates fast on/off transitions. Subthreshold swing (s-value) may also characterize the switching behavior, with a smaller s-value indicating faster on/off transitions.

A TFT also may be characterized by its off-current. Off-current refers to the leakage current with gate electrode below the threshold voltage. Leakage current can lead to reduced performance characteristics; for example, leakage current in a display device TFT may manifest in a change in pixel brightness, an increase in noise, a reduction in the grayscale shades, and an increase in power consumption.

High mobility, low off-current, low subthreshold slope TFTs having low temperature processing capabilities are useful for flexible electronics. Active channel materials having narrow bandgaps have relatively high carrier mobilities. However, the off-currents of TFTs including channels of such materials may be high. According to various implementations, TFT characteristics including high mobility and low off-currents are described herein. In some implementations, the TFTs disclosed herein include narrow bandgap active channel materials, which may have high mobilities, and p-n hetero-junctions, which can suppress off-currents. In some implementations, the TFTs may exhibit tunneling behavior in their on-states and be referred as tunnel TFTs.

Figure 5:
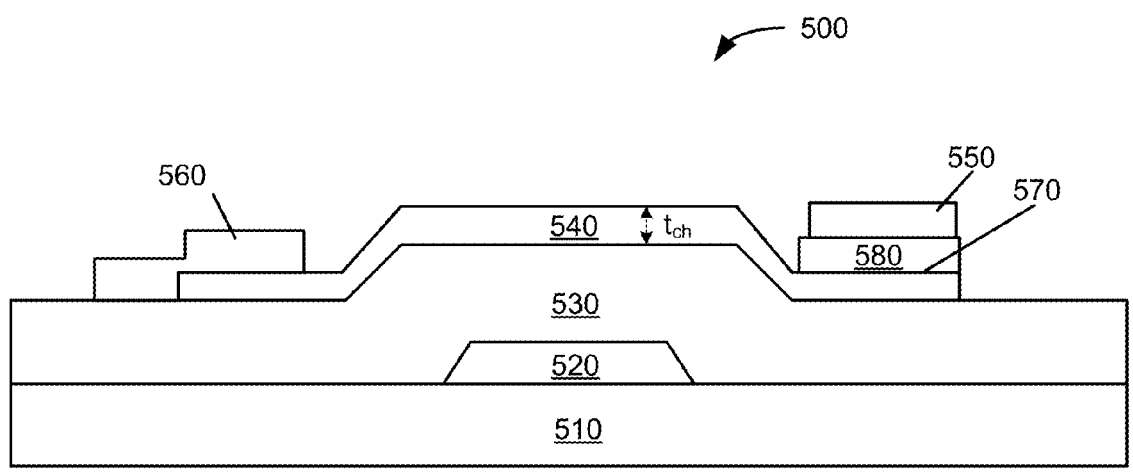
FIG. 5 is an example of a cross-sectional diagram illustrating a TFT including a source-side p-n hetero-junction according to some implementations.

FIG. 5 is an example of a cross-sectional diagram illustrating a TFT including a source-side p-n hetero-junction according to some implementations. The TFT 500 includes a substrate 510, a gate electrode 520, a gate dielectric 530, a source electrode 550 and a drain electrode 560 as described above with respect to FIG. 4A. The TFT 500 also includes semiconductor layers 540 and 580, which together form a p-n hetero-junction 570. The semiconductor layer 540 is the active channel layer of the TFT 500 and is a narrow bandgap material. The semiconductor layer 580 is a wide bandgap material that is disposed between the source electrode 550 and the active channel layer formed by the semiconductor layer 540. The semiconductor layer 540 has a thickness $t_{ch}$, as depicted. Example thicknesses $t_{ch}$ of the semiconductor layer 540 are discussed further below with respect to FIG. 9.

Certain examples of materials for the source electrode 550 and the drain electrode 560 are given above with respect to FIGS. 4A and 4B though any material that can make ohmic contact with the n-type and p-type semiconductor layers may be employed. For example, Au, Cu, Pt, Ni, ruthenium (Ru), iridium (Ir), ruthenium oxide ($RuO_2$), iridium oxide ($IrO_2$), tungsten nitride (WN), and tantalum nitride (TaN) may be used as a drain electrode material, while Ti, Mo, Ta, W, Al, indium tin oxide (ITO), indium zinc oxide (IZO) and titanium nitride (TiN) may be used as a source electrode material for an oxide semiconductor-based hetero-junction structure as shown in FIG. 5. In some implementations, metals having a work function less than about 4.3 eV may be used for the n-side and metals having a work function greater than 4.3 eV may be used for the p-side.

The p-n hetero-junction 570 is only on the source-side of the TFT 500 such that the semiconductor layer 540 contacts the drain electrode 560. As used herein the term "source-side p-n hetero-junction" refers to a hetero-junction that is on the source-side, disposed between the source electrode and the active channel layer of a TFT, and that is not on the drain side. As used herein, the term "p-n hetero-junction" refers to an interface between a p-type semiconductor and an n-type semiconductor that have dissimilar bandgaps. As indicated above, the active channel material is a narrow bandgap material; for example, in a p-channel TFT, a narrow bandgap p-type semiconductor can be used as the active layer with a wide bandgap n-type semiconductor employed to form a p-n hetero-junction with large conduction and valence band discontinuities. Similarly, a narrow bandgap n-type semiconductor active channel and a wide bandgap p-type semiconductor can be used for an n-channel TFT.

The p-n hetero-junction forms a depletion region across which carriers tunnel to form the source-drain current. In an off-state, the current is suppressed by the large conduction band and valence band discontinuities at the p-n hetero-junction. Hetero-junction structures with large band discontinuities have reduced effective tunneling barriers and enhanced tunnel probabilities in the depletion layer. This is discussed below with reference to TFTs having source-side p-n hetero-junctions.

Figure 6A:
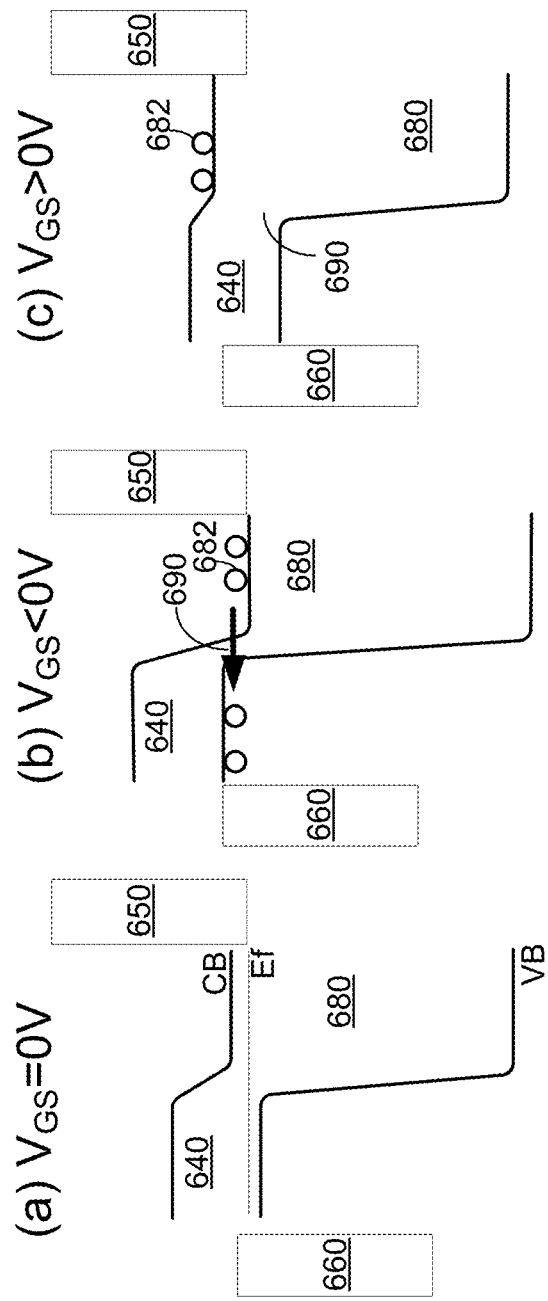
FIG. 6A provides examples of band diagrams of a p-channel TFT including a p-n hetero-junction formed from a narrow bandgap p-type oxide semiconductor and a wide bandgap n-type oxide semiconductor.

FIG. 6A provides examples of band diagrams of a p-channel TFT including a p-n hetero-junction formed from a narrow bandgap p-type oxide semiconductor and a wide bandgap n-type oxide semiconductor. FIG. 6A shows the band diagrams at the following gate-source voltages ($V_{GS}$): (a) $V_{GS}=0V$, (b) $V_{GS}<0V$ (on state), and (c) $V_{GS}>0V$ (off state). At (a), FIG. 6A shows the source electrode 650 and the drain electrode 660. The conduction band (CB) and the valence band (VB) of a narrow bandgap p-type oxide semiconductor channel layer 640 and a wide bandgap n-type oxide semiconductor 680 are shown as is the Fermi energy level ($E_f$). At (b), under a negative gate bias condition ($V_{GS}<0$), the depletion layer width at the p-n hetero-junction 690 narrows allowing carriers 682 injected from the source electrode 650 to tunnel from the conduction band in the wide bandgap n-type oxide semiconductor 680 to the valence band in the narrow bandgap p-type oxide semiconductor channel layer 640. This is referred to as band-to-band tunneling, and allows current to flow and the TFT to operate in an on-state. When a positive gate bias ($V_{GS}>0$) is applied at (c), the current flow is suspended by the large conduction band and valence band discontinuities at the p-n hetero-junction 690. As a result, the off-current is suppressed; in certain implementations, for example, an off-current of less than about 1 nanoampere is provided and may be as low as less than about 10 picoamperes, less than about 1 picoampere, less than about 0.1 picoamperes, or less than about 0.05 picoamperes.

Figure 6B:
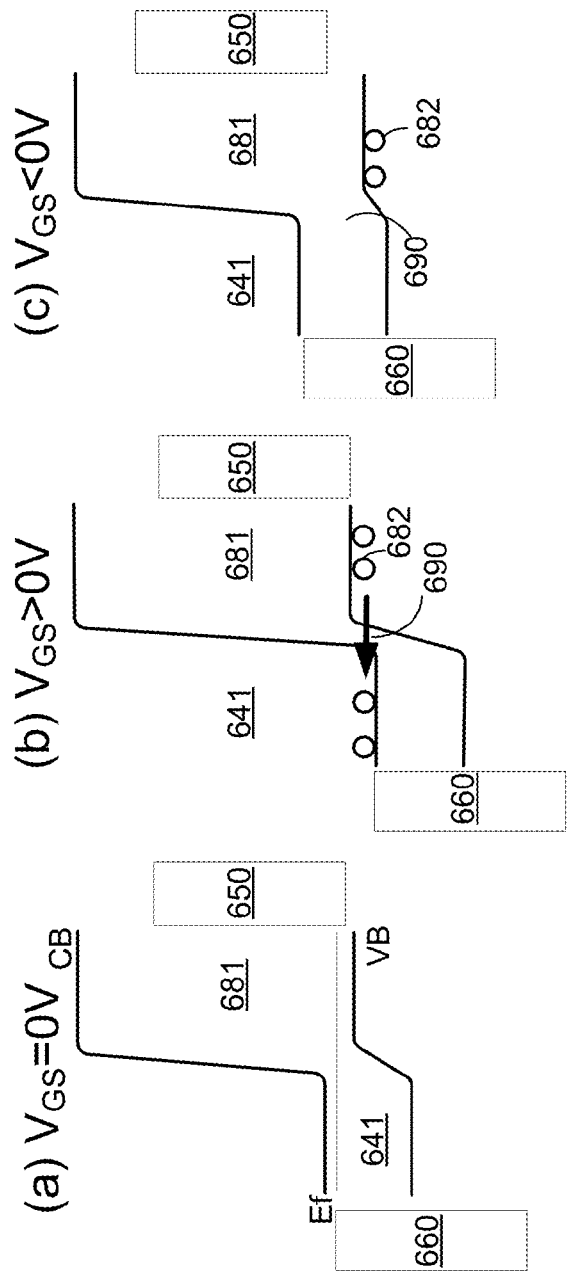
FIG. 6B provides examples of band diagrams of an n-channel TFT including a p-n hetero-junction formed from a narrow bandgap n-type oxide semiconductor and a wide bandgap p-type oxide semiconductor.

Off-current suppression may also be achieved in an n-channel TFT using a narrow bandgap n-type material. FIG. 6B provides examples of band diagrams of an n-channel TFT including a p-n hetero-junction formed from a narrow bandgap n-type oxide semiconductor and a wide bandgap p-type oxide semiconductor. FIG. 6B shows the band diagrams at the following gate-source voltages ($V_{GS}$): (a) $V_{GS}=0V$, (b) $V_{GS}>0V$ (on state), and (c) $V_{GS}<0V$ (off state). At (a), FIG. 6B shows the source electrode 650 and the drain electrode 660. The conduction band (CB) and the valence band (VB) of a narrow bandgap n-type oxide semiconductor channel layer 641 and a wide bandgap n-type oxide semiconductor 681 are shown as is the Fermi energy level ($E_f$). At (b), under a positive gate bias condition ($V_{GS}>0$), the depletion layer width at the p-n hetero-junction 690 narrows allowing carriers 682 injected from the source electrode 650 to tunnel from the valence band in the wide bandgap p-type oxide semiconductor 681 to the conduction band in the narrow bandgap n-type oxide semiconductor channel layer 641. When a negative gate bias ($V_{GS}<0$) is applied at (c), the current flow is suspended by the large conduction band and valence band discontinuities at the p-n hetero-junction 690.

Figure 7:
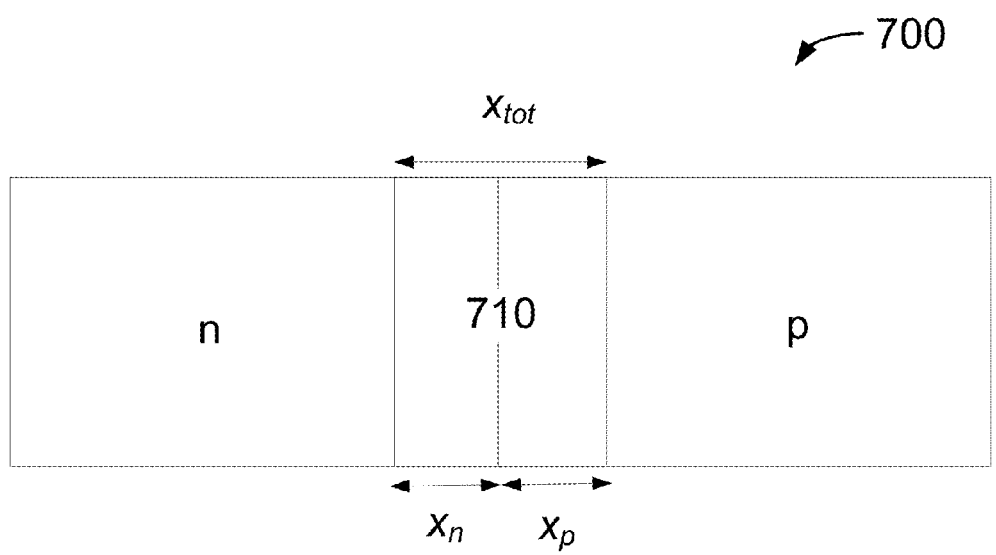
FIG. 7 shows an example of a schematic diagram of a depletion region of a p-n hetero-structure that may be implemented in a TFT according to various implementations.

As indicated above, a depletion region is formed across the p-n hetero-junction of TFTs disclosed herein. The depletion region refers to a region with no mobile carriers, which forms when diffused electrons from the n-side of the p-n hetero-junction recombine with holes on the p-side and diffused holes from the p-side recombine with electrons on the n-side. The resulting region has uncompensated ions with no mobile carriers and forms a potential barrier. FIG. 7 shows an example of a schematic diagram of a depletion region 710 of a p-n hetero-structure 700 that may be implemented in a TFT according to various implementations. The width $x_{tot}$ of the depletion region includes the widths $x_n$ and $x_p$ of the n-side and p-side depletion regions as shown. The probability of tunneling across the energy barrier of the depletion region increases as the depletion region width $x_{tot}$ decreases.

Figure 8:
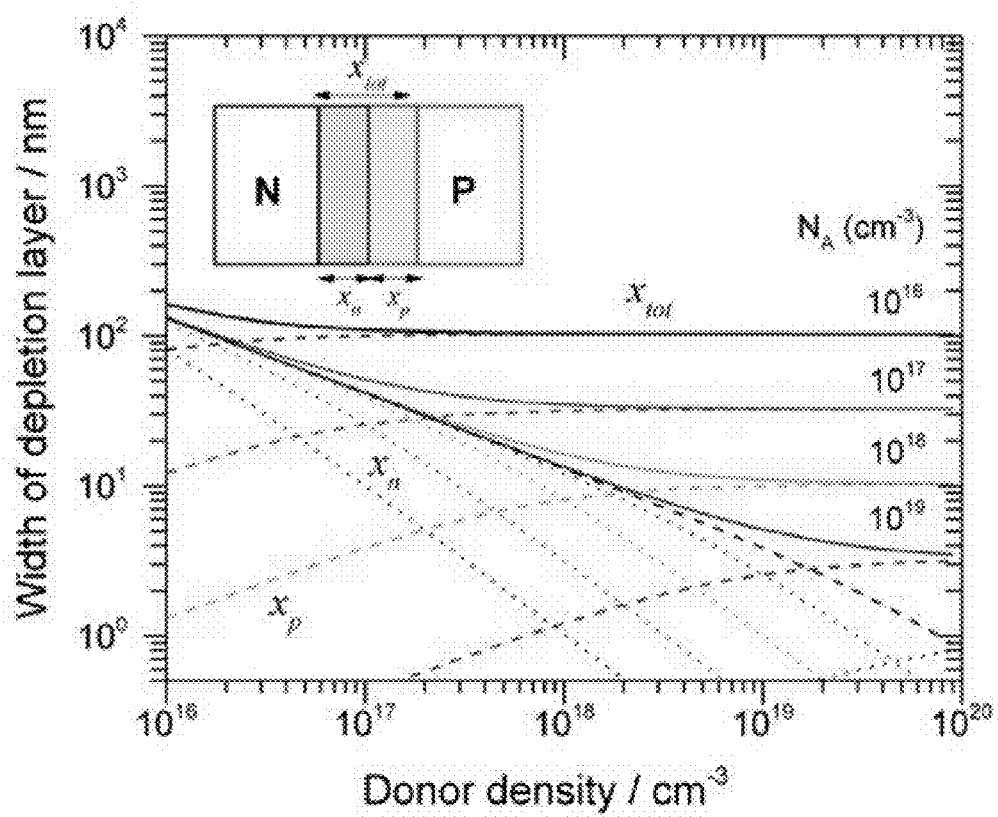
FIG. 8 is an example of a diagram showing the variation of a depletion layer width for a p-n hetero-junction composed of p-type tin (II) oxide (p-SnO) and n-type indium gallium zinc oxide (n-IGZO) for several donor/acceptor densities at a gate-source voltage of zero ($V_{GS}$=0).

The width of the depletion region is a function of applied bias and carrier concentration for a particular p-n hetero-structure. FIG. 8 is an example of a diagram showing the variation of a depletion layer width for a p-n hetero-junction composed of p-type tin (II) oxide (p-SnO) and n-type indium gallium zinc oxide (n-IGZO) for several donor/acceptor densities at a gate-source voltage of zero ($V_{GS}=0$). The solid lines represent the variation of $x_{tot}$ with different acceptor densities ($N_A$), with the dashed lines indicating p-side depletion layer width ($x_p$) and the dotted lines indicating n-side depletion layer width ($x_n$). The bandgaps of the p-SnO and n-IGZO materials are 0.8 eV and 3.1 eV, respectively.

The widths, $x_p$ and $x_n$, may be calculated by the following equations:

$$x_p = \sqrt{\frac{2\varepsilon N_d}{qN_a(N_a+N_d)}V_{bi}};$$

$$x_n = \sqrt{\frac{2\varepsilon N_a}{qN_d(N_a+N_d)}V_{bi}};$$

$$x_{tot} = x_p + x_n; \text{ and}$$

-continued $$V_{bi} = \frac{k_B T}{q}\left(\frac{N_a N_d}{N_i^2}\right)$$

$$x_{tot} = x_p + x_n$$

where $V_{bi}V_{bi} = \frac{k_B T}{q}\left(\frac{N_a N_d}{N_i^2}\right)$ is the built-in potential, $\varepsilon$ is the permittivity, $N_a$ is the acceptor density, $N_d$ is donor density, $N_i$ is intrinsic density, q is electron charge, $k_B$ is the Boltzmann constant and T the temperature.

A diagram such as shown in the example of FIG. 8 may be used to determine the minimum carrier densities for a particular depletion region width. According to various implementations, the carrier densities in the p-type and n-type semiconductors that form a p-n hetero-junction may be at least $5\times10^{18}/cm^3$ to facilitate a narrow width depletion region and a high tunneling current. For example, in FIG. 8, a width $x_{tot}$ of the depletion region of 10 nm or less corresponds to donor/acceptor densities of at least $5\times10^{18}/cm^3$.

A depletion region width of 10 nm can correspond to a depletion region of about 2 nm, for example, under an applied voltage. Depletion region widths of 20 nm or less, or 10 nm or less, at $V_{GS}=0$ may be employed in some implementations. While FIG. 8 shows the relation between depletion region width and carrier densities in a p-SnO/n-IGZO hetero-junction structure, similar values may be expected to be derived for various different hetero-junctions. As such, carrier densities of at least $10^{18}/cm^3$, or at least $10^{19}/cm^3$, or at least $10^{20}/cm^3$ may be employed in certain implementations for a variety of p-n hetero-junction structures. It is noted that many conventional undoped oxide, nitride, and sulfide semiconductor materials have carrier densities around $10^{16}/cm^3$. As such, highly doped semiconductors may be employed in some implementations.

Figure 9:
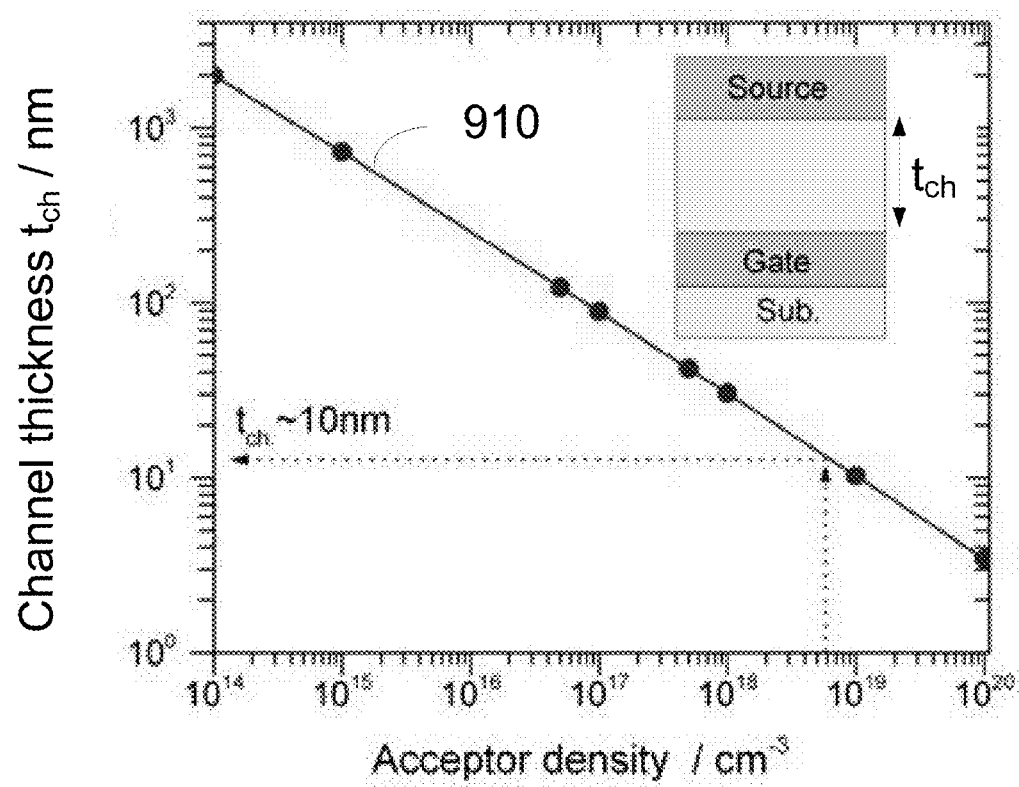
FIG. 9 is an example of a diagram showing the maximum channel thickness as a function of acceptor density for a p-channel TFT.

In some implementations, the TFTs disclosed herein may include a relatively thin channel layer. Referring to FIG. 5, for example, the thickness $t_{ch}$ of the semiconductor layer 540 may be relatively small to fully deplete channels having high carrier densities. If the channel is too thick, the applied gate bias may not sufficiently control the conduction in the semiconductor layer. FIG. 9 is an example of a diagram showing the maximum channel thickness as a function of acceptor density for a p-channel TFT. Line 910 indicates the maximum channel thickness for which carriers can fully be depleted in operation of a p-channel TFT for various acceptor densities at an applied voltage of zero. To fully deplete carriers for a p-channel with high acceptor density, the channel thickness is thin. The depletion layer width, W, formed by a metal oxide semiconductor (MOS) structure may be estimated by the following equation:

$$W = 2\sqrt{\frac{\varepsilon k_B T \ln(N_a/N_i)}{q^2 N_a}}$$

Therefore, the channel thickness is less than the gate bias induced-depletion layer to fully deplete carriers. The charged density Q modulated by gate bias $V_g$ may be estimated by the following equation:

$$Q=CV_g$$

where C is the gate capacitance per unit area. In an example, the charge density Q in a typical TFT structure is about $4\times10^{19}/cm^3$ for a $V_g=20V$, 10 nm-thick $SiO_2$ gate insulator and a 10 nm-thick channel layer. In this example, a channel thickness of less than 10 nm may be used to fully deplete carriers.

The diagram in FIG. 9 may be used in conjunction with a diagram such as that in FIG. 8 to first determine the carrier density for a desired depletion width (and thus tunneling current) and then determine the channel thickness for the determined carrier density. FIG. 9 is generally applicable to estimate maximum channel thicknesses of both n and p-channel TFTs. It shows that while channel thicknesses of 100 nm may be tolerable for relatively low carrier densities (e.g., $10^{16}/cm^3$) that may be employed in conventional oxide TFTs, thinner channels may be employed with the tunnel TFTs disclosed herein. As an example, for a carrier density of $10^{18}/cm^3$, the channel thickness may be no more than about 40 nm thick. Example channel thicknesses may range from about 5 nm to about 40 nm.

In some implementations, one or both of the p-type and n-type semiconductor layers may be metal oxide films. Examples of p-type metal oxide films include copper (I) oxide ($Cu_2O$), copper (II) oxide (CuO), tin (II) oxide (SnO), nickel (II) oxide (NiO), lead (II) oxide (PbO), silver (I) oxide ($Ag_2O$); $ZnRh_2O_4$ (zinc rhodium oxide; ZRO) and p-type copper delafossites of the formula $CuMO_2$, where M is a metal, as well as compounds including one or more further metal cations to form ternary, quaternary, or higher order compounds.

Examples of n-type metal oxide films includes indium (In)-containing, zinc (Zn)-containing, tin (Sn)-containing, hafnium (Hf)-containing, and gallium (Ga)-containing n-type oxide semiconductors such as InGaZnO, InZnO, InHfZnO, InSnZnO, SnZnO, InSnO, GaZnO, and ZnO.

The p-n hetero-structures disclosed herein may be formed from other compound semiconductors in addition to metal oxide semiconductors, including metal nitrides, metal sulfides, and metal selenides.

Examples of p-type metal sulfide films include copper (I) sulfide ($CuS_2$), copper gallium sulfide ($CuGaS_2$), copper indium sulfide ($CuInS_2$), barium copper sulfide ($BaCu_2S$), molybdenum disulfide ($MoS_2$), and tin (II) sulfide (SnS), as well as compounds including one or more further metal cations to form ternary, quaternary, or higher order compounds. Examples of p-type metal oxide sulfide films include lanthanum copper oxysulfides (LaCuOS) and strontium copper gallium oxide, as well as compounds including one or more further metal cations to form ternary, quaternary, or higher order compounds. Examples of n-type metal sulfide films include cadmium sulfide (CdS) as well as compounds including one or more further metal cations to form ternary, quaternary, or higher order compounds.

Examples of metal nitride films include gallium nitride (GaN) as well as compounds including one or more further metal cations to form ternary, quaternary, or higher order compounds. GaN and other metal nitride films may be prepared or doped appropriately to form p-type or n-type semiconductors.

It is understood that certain of these and other oxide, nitride or sulfide compounds may be doped appropriately to form p-type or n-type semiconductors. Further, the method of fabrication may be adjusted to form p-type or n-type semiconductors. For example, molybdenum disulfide ($MoS_2$) has been reported to be p-type when deposited by chemical vapor deposition (CVD) whereas naturally grown $MoS_2$ is an n-type semiconductor.

As indicated above, in some implementations, one or both of the p-type and n-type materials that form the p-n hetero-junction may be doped to increase the carrier concentration. As an example, p-type SnO, which has a carrier concentration of about $10^{16}/cm^2$, may be doped with lithium (Li) to increase the carrier concentration to $10^{18}/cm^3$ or greater As indicated above, the p-n hetero-junctions are formed from an active channel semiconductor material and a second semiconductor material. The active channel semiconductor material is a narrow bandgap material, while the second semiconductor material is a wide bandgap material. As used herein, bandgap refers to the indirect bandgap, which is important for electronic properties. Narrow bandgap materials include semiconductors having bandgaps of 1.0 eV or less, while wide bandgap materials include semiconductors having bandgaps of 3.0 eV or greater. Semiconductors that have bandgaps between 1.0 and 3.0 eV may also be used in the p-n hetero-structures disclosed herein as narrow or wide bandgap semiconductors depending on the hetero-structure. As used herein, a wide bandgap semiconductor of a p-n hetero-structure is a material that has a larger bandgap than the other semiconductor of the p-n hetero-structure. A narrow bandgap semiconductor of a p-n hetero-structure is a material that has a smaller bandgap than the other semiconductor of the p-n hetero-structure. In some implementations, the wide bandgap semiconductor of a p-n hetero-structure has a bandgap of at least 0.5 eV greater than the bandgap of the narrow bandgap semiconductor of the p-n hetero-structure. In some implementations, the wide bandgap semiconductor of a p-n hetero-structure has a bandgap of at least 1.0 eV, at least 1.5 eV greater or at least 2.0 eV greater than the bandgap of the narrow bandgap semiconductor. As discussed above, p-n hetero-junctions with large band discontinuities have reduced effective tunneling barriers and enhanced tunnel probabilities.

The quality of the interface between the p-type semiconductor layer and the n-type semiconductor layer is important to achieve high tunneling rates. The p-n hetero-structures disclosed herein may have amorphous or nanocrystalline character. As such, the interface quality is much higher than achieved with crystalline silicon, for example.

The quantum tunneling current, J(E), is calculated by the following equation:

$$J(E) = \frac{qk_bTm^*}{2\pi^2\hbar^3}T(E)\ln\left\{\frac{1+\exp[E_{Fl}-E]/k_bT}{1+\exp[E_{Fr}-E]/k_bT}\right\}\Delta E$$

where $k_bT$ is Boltzmann's constant times temperature, q is the electric charge, $\hbar$ is the reduced planks constant, m* is effective mass, $E_{Fl}$ and $E_{Fr}$ are the quasi-Fermi levels on either side of the barrier, and T(E) is tunneling probability. The tunneling probability over the depletion region from $x_1$ to $x_2$ may be determined by the WKB method using the following approximation:

$$T(E) \sim \exp[-2\int_{x_1}^{x_2}|k(x)|dx]$$

where k(x) is the wave vector and is given for a triangular potential barrier by the following equation:

$$k(x) = \sqrt{\frac{2m^*}{\hbar}\left(\frac{E_g}{\hbar}-qEx\right)}$$

where $E_g$ is the bandgap and E is the electric field. Therefore, the tunneling probability for a triangular potential barrier may be rewritten as follows:

$$T(E) \sim \exp\left[-\frac{4}{3}\frac{E_g^{3/2}\sqrt{2m^*}}{qE\hbar}\right]$$

Figure 10A:
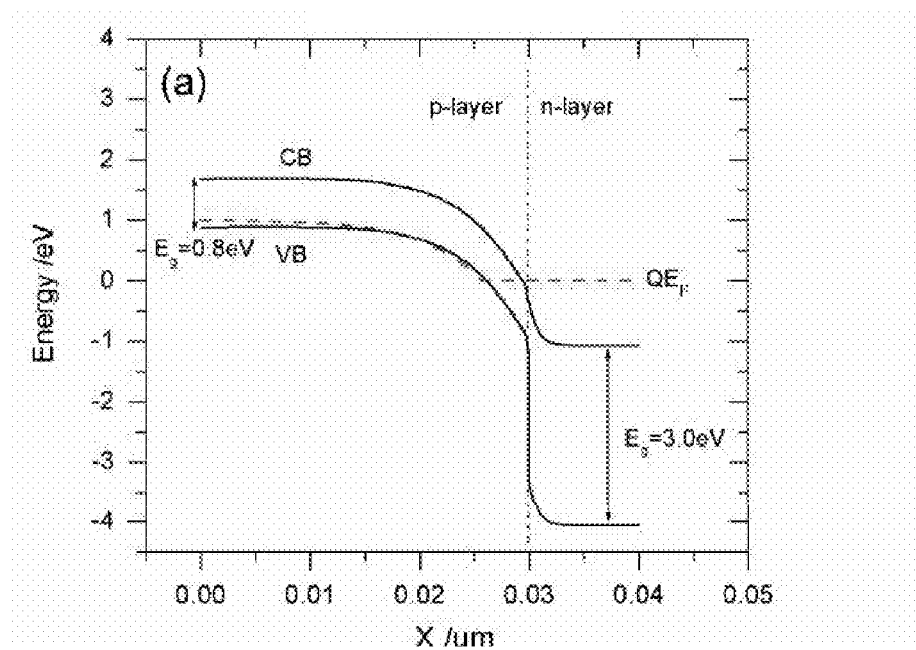
FIGS. 10A and 10B are examples of schematic energy band diagrams of p-n hetero-junction structures having a narrow bandgap (0.8 eV) p-type semiconductor layer and a wide bandgap (3.0 eV) n-type semiconductor layer at a gate bias of −3V and a drain bias of −1V.
Figure 10B:
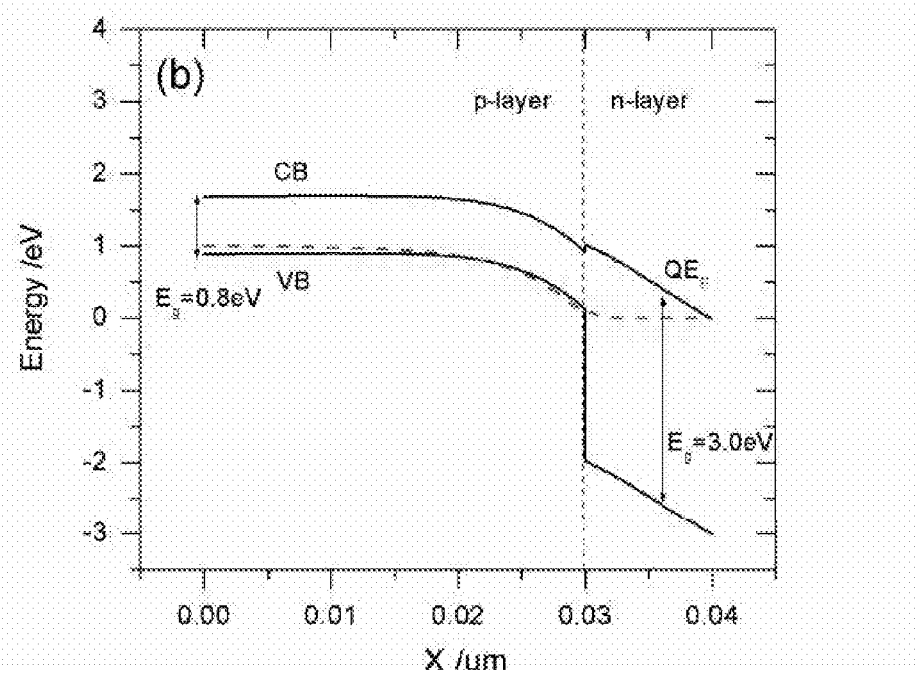

FIGS. 10A and 10B are examples of schematic energy band diagrams of p-n hetero-junction structures having a narrow bandgap (0.8 eV) p-type semiconductor layer and a wide bandgap (3.0 eV) n-type semiconductor layer at a gate bias of −3V and a drain bias of −1V. The narrow bandgap of 0.8 eV corresponds to p-type SnO and the wide bandgap of 3.0 eV corresponds to n-type a-IGZO. In the example of FIG. 10A, the acceptor density $N_a$ for the p-type layer and the donor density $N_d$ for the n-type layer are $1\times10^{18}/cm^3$ and $1\times10^{21}/cm^3$, respectively. The steep hetero-junction in FIG. 10A is formed due to the large band discontinuity and highly doped n-type layer. Electrons tunnel from the highly doped n-type layer to the p-type layer at a sufficiently high donor density $N_d$. For comparison, an energy band diagram for a donor density $N_d$ of $5\times10^{18}$ for the n-type layer is shown in the example of FIG. 10B.

Figure 10C:
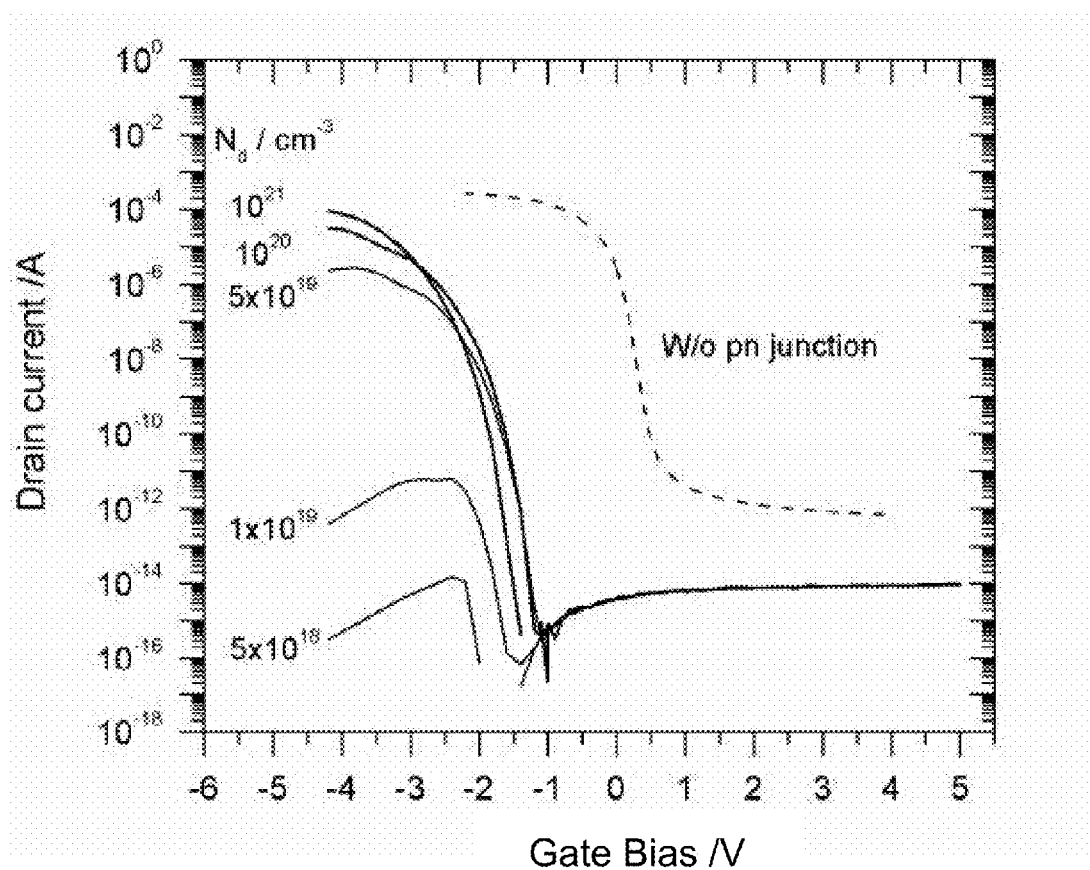
FIG. 10C is an example of simulated $I_{DS}$-$V_{GS}$ curves for a tunnel TFT including a p-n hetero-junction composed of narrow bandgap p-type SnO with 0.8 eV and wide band gap n-type IGZO with 3.0 eV for various donor densities.

FIG. 10C is an example of simulated $I_{DS}$-$V_{GS}$ curves for a tunnel TFT including a p-n hetero-junction composed of narrow bandgap p-type SnO with 0.8 eV and wide band gap n-type IGZO with 3.0 eV for various donor densities. The acceptor density $N_a$ for the p-type layer is set to $1\times10^{18}$ cm$^{-3}$ while the donor density $N_d$ is varied from $5\times10^{18}/cm^3$ to $1\times10^{21}/cm^3$. For comparison, an $I_{DS}$-$V_{GS}$ curve for a conventional p-channel TFT without an n-type layer is also shown. When the $N_d$ for the n-type layer is over $5\times10^{19}/cm^3$, clear p-channel transistor action, i.e., switching characteristics, is observed.

As discussed above, the off-current in tunnel TFT devices disclosed herein is well suppressed and reduced to as low as 0.01 pA, which is two orders of magnitude lower than that for conventional TFTs. The threshold voltage is negative, indicating that the tunnel TFT in the example of FIG. 10C operates in accumulation mode. The threshold voltage maybe controlled by the acceptor density of the p-type layer. A highly doped n-type layer is may be implemented to obtain a high on-current.

Figure 11:
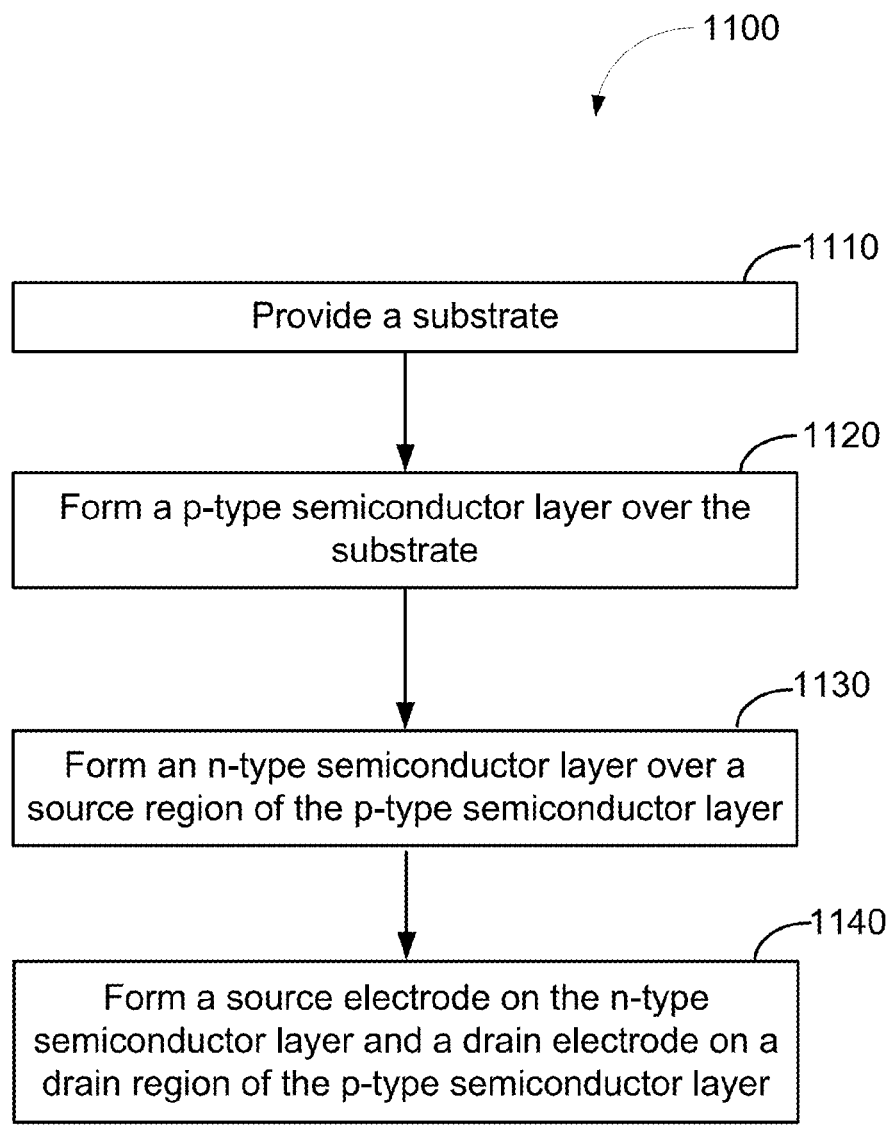
FIG. 11 is a flow diagram illustrating an example of operations of a method of fabricating a p-channel TFT including a p-n hetero-junction according to some implementations.

FIG. 11 is a flow diagram illustrating an example of operations of a method of fabricating a p-channel TFT including a p-n hetero-junction according to some implementations. The process 1100 may be performed in different orders and/or with different, fewer or additional operations. In some implementations, the process 1100 may be described with reference to one or more processing chambers and a controller, where the controller may be programmed to control any operations described herein.

At block 1110 of the process 1100, a substrate is provided. The substrate can include any substrate material, including a substantially transparent material, such as glass or plastic. Substantial transparency as used herein can be defined as transmittance of visible light of about 70% or more, such as about 80% or more, or about 90% or more. Glass substrates (sometimes referred to as glass plates or panels) may be or include a borosilicate glass, a soda lime glass, photoglass, quartz, Pyrex®, or other suitable glass material. A non-glass substrate can be used, such as a polycarbonate, acrylic, polyimide, polyethylene terephthalate (PET), or polyether ether ketone (PEEK) substrate. Other suitable substrate materials can include flexible substrate materials. In some implementations, the substrate can have dimensions of a few microns to hundreds of microns.

At block 1120 of the process 1100, a p-type semiconductor layer is formed over the substrate. Examples of p-type semiconductors are given above and include metal oxide, metal sulfide, and metal nitride semiconductors. The p-type semiconductor layer includes a channel region aligned or to be aligned with a gate electrode, where the channel region is between a source region and a drain region of the p-type semiconductor layer. In some implementations, the p-type semiconductor layer can be between about 10 nm and about 100 nm thick. Block 1120 can involve deposition of the p-type semiconductor layer by any method appropriate for the material being deposited, including physical vapor deposition (PVD) processes, CVD processes, and atomic layer deposition (ALD) processes. PVD processes include thermal evaporation deposition, sputter deposition and pulsed laser deposition (PLD) processes. For example, SnO may be deposited by sputtering a SnO target. As noted above, however, in some implementations the p-type semiconductor layer may be between about 5 nm and 40 nm. To deposit thin p-type semiconductor layers, ALD processes may be employed in some implementations. Forming the source and drain regions of the p-type semiconductor layer can involve doping these regions of the p-type semiconductor layer.

At block 1130 of the process 1100, an n-type semiconductor is deposited over the source region of the p-type semiconductor layer. Examples of p-type semiconductors are given above and include metal oxide, metal sulfide, and metal nitride semiconductors. In some implementations, the n-type semiconductor layer can be less than about 10 nm. Block 1130 can involve deposition of the n-type semiconductor layer by any method appropriate for the material being deposited, including PVD processes, CVD processes, and ALD processes.

At block 1140 of the process 1100, a source electrode is formed on the n-type semiconductor layer and a drain electrode is formed on a drain region of the p-type semiconductor layer. To form the source electrode and the drain electrode, the source electrode and the drain electrode may be etched. Thus, the process 1100 may further include etching the source electrode and the drain electrode to expose the channel region of the p-type semiconductor layer.

In some implementations, the process can include forming one or more dielectric layers or metal layers on p-type semiconductor layer. For example, in some implementations, a dielectric oxide layer is formed over the p-type semiconductor layer so that the dielectric oxide layer is contacting the p-type semiconductor layer. The dielectric oxide layer may be one of a passivation layer, a gate dielectric layer, and an etch stop layer, for example. The dielectric oxide layer can include any suitable dielectric oxide material, such as $SiO_2$ or $Al_2O_3$. In some implementations, the dielectric oxide layer can be between about 10 nm and about 1000 nm thick, such as between about 300 nm and about 500 nm thick.

In some implementations, forming the dielectric oxide layer occurs before forming the source electrode and the drain electrode. This can include instances where the dielectric oxide layer is an etch stop layer or a gate dielectric. In some implementations, forming the dielectric oxide layer can occur after forming the source electrode and the drain electrode. This can include instances where the dielectric oxide layer is a passivation layer formed over the source electrode and the drain electrode to protect the TFT.

In some implementations, the process 1100 further includes forming a gate electrode over the substrate. In some implementations, the gate electrode may be formed on the substrate, and a gate dielectric may be formed on the gate electrode for a bottom gate TFT. In some implementations, the dielectric oxide layer may serve as the gate dielectric, and the gate electrode may be formed over the gate dielectric for a top gate TFT.

In some implementations, the process 1100 may be modified to form an n-channel TFT. In such implementations, block 1120 may involve forming an n-type semiconductor layer on the substrate and block 1130 may involve forming a p-type semiconductor layer on a source region of the n-type semiconductor layer. Block 1140 may involve forming a source electrode on the p-type semiconductor layer and a drain electrode on a drain region of the n-type semiconductor layer.

Figure 12:
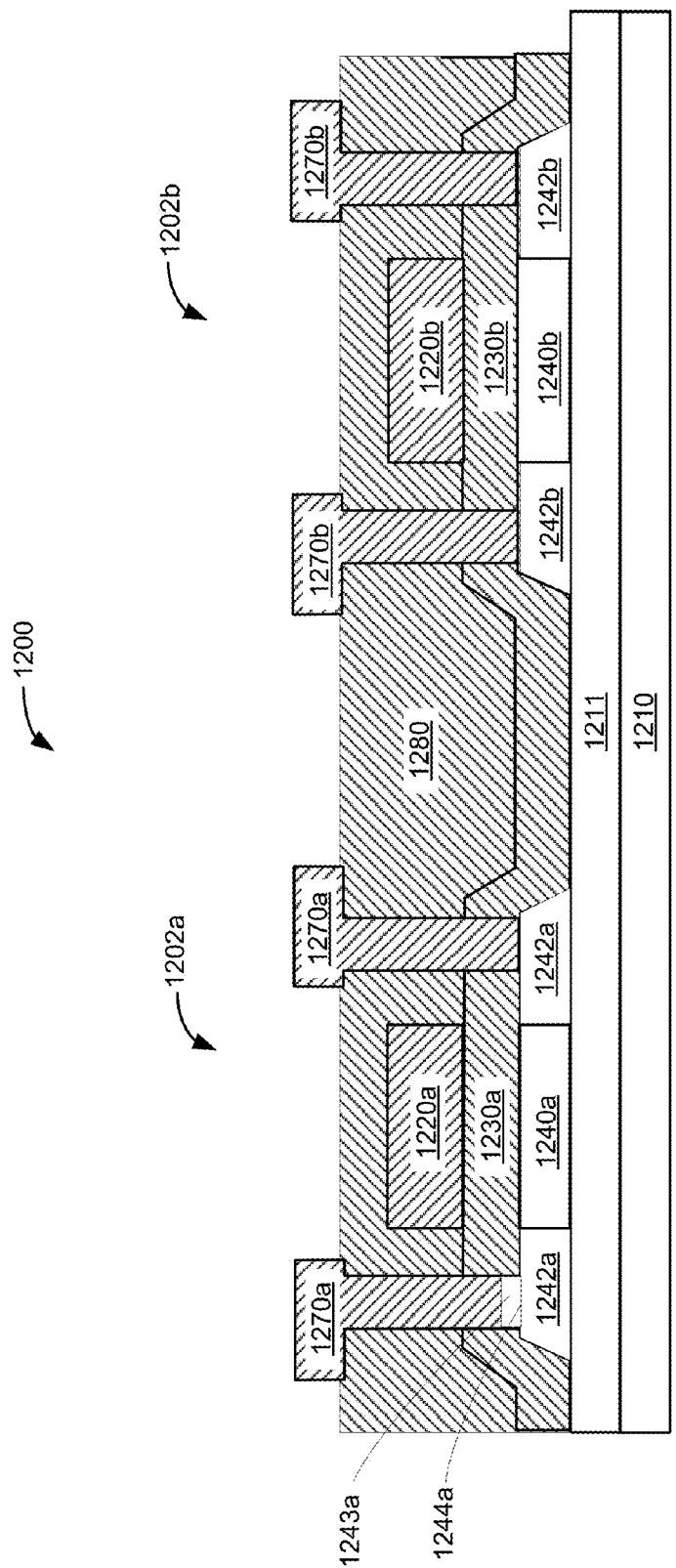
FIG. 12 is an example of a cross-sectional diagram illustrating a complementary metal-oxide-semiconductor (CMOS) TFT device according to some implementations.

In some implementations, a TFT as disclosed above may form part of a CMOS TFT device including a p-type TFT and an n-type TFT. FIG. 12 is an example of a cross-sectional diagram illustrating a CMOS TFT device according to some implementations. In FIG. 12, a CMOS TFT device 1200 includes a p-type top gate TFT 1202a and an n-type top gate TFT 1202b on a substrate 1210. Examples of substrates are described above. In the example of FIG. 12, the p-type top gate TFT 1202a and the n-type top gate TFT 1202b are formed on a dielectric layer 1211; in some implementations, however, they may be formed on the substrate 1210 as in the example of FIG. 4B.

The p-type top gate TFT 1202a includes a p-type semiconductor layer including a channel region 1240a and source and drain regions 1242a. The p-type top gate TFT 1202a also includes a p-type semiconductor layer having source and drain regions 1242a, source and drain electrodes 1270a, and an n-type semiconductor layer 1243a. The n-type semiconductor layer 1243a is disposed between an electrode 1270a and a region 1242a of the p-type semiconductor layer, e.g., between a source electrode 1270a and a source region 1242a of the p-type semiconductor layer. A gate electrode 1220a overlies a gate dielectric 1230a. The p-type semiconductor layer of the p-type TFT 1202a may include any of the p-type semiconductors discussed above.

The n-type top gate TFT 1202b includes an n-type semiconductor layer including a channel region 1240b and source and drain regions 1242b. Source and drain electrodes 1270b contact the source and drain regions 1242b of the n-type metal oxide layer, and a gate electrode 1220b overlies a gate dielectric 1230b. The source and drain electrodes 1270a and 1270b may be formed in a dielectric layer 1280, which separates the p-type top gate TFT 1202a and the n-type top gate TFT 1202b.

In some implementations, the n-type semiconductor is amorphous and can include In-containing, Zn-containing, Sn-containing, Hf-containing, and Ga-containing oxide semiconductors. Examples of n-type amorphous oxide semiconductors include InGaZnO, InZnO, InHfZnO, InSnZnO, SnZnO, InSnO, GaZnO, and ZnO.

In the example of FIG. 12, the p-type TFT 1202a includes a p-n hetero-junction 1244a and may be a tunnel TFT as described above. In alternate implementations, the n-type TFT 1202b may include a p-n hetero-junction and be a tunnel TFT, in addition to or instead of the p-type TFT 1202a.

In some implementations, the CMOS TFT includes bottom gate TFTs as discussed above with reference to FIG. 4A or dual gate TFTs. A CMOS TFT device, such as shown in the example of FIG. 12, may be used as part of a driving circuit, for example, of a display device.

Figure 13A:
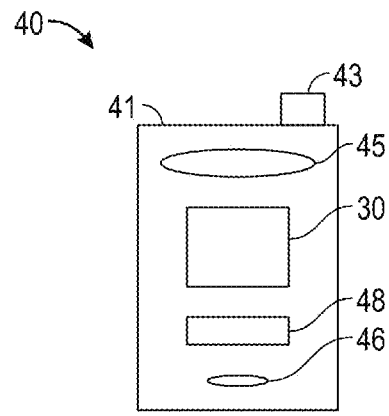
FIGS. 13A and 13B are system block diagrams illustrating a display device that includes a plurality of IMOD display elements.
Figure 13B:
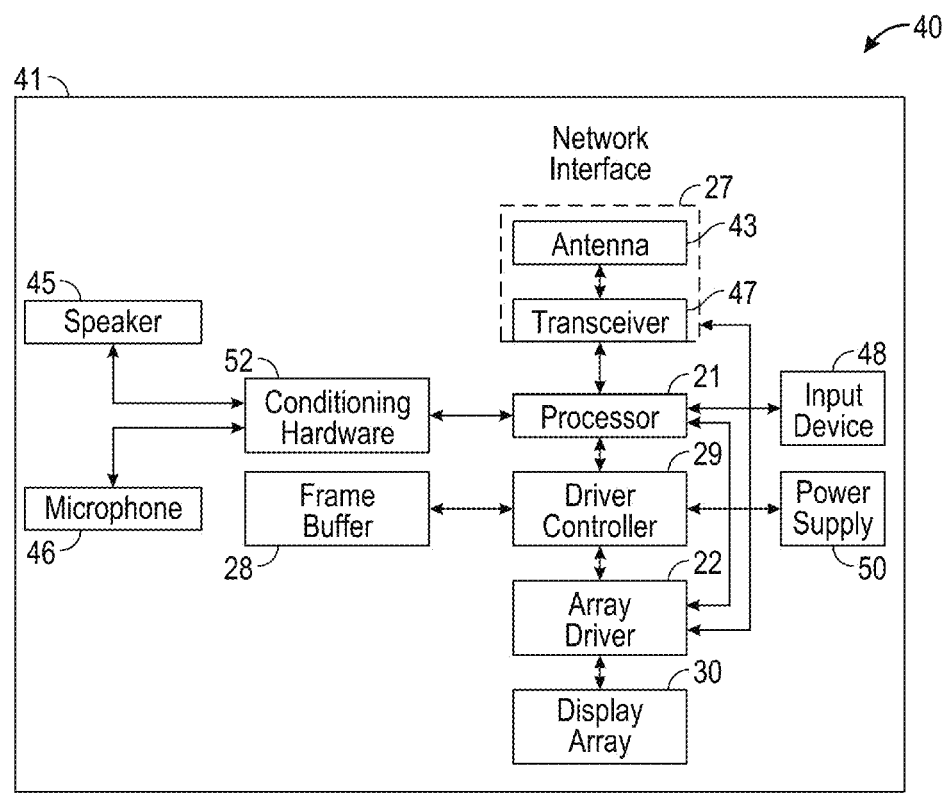

FIGS. 13A and 13B are system block diagrams illustrating a display device 40 that includes a plurality of IMOD display elements and a TFT as described herein. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 8A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 8A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising a thin film transistor (TFT), the TFT comprising:
   a source electrode;
   a drain electrode;
   a first semiconductor layer connecting the source electrode and the drain electrode, the first semiconductor layer including a source region, a channel region and a drain region; and
   a source-side p-n heterojunction between the source electrode and the source region of the first semiconductor layer, wherein the source side p-n hetero-junction is not on the drain region side of the TFT transistor, and wherein the first semiconductor layer includes an oxide, sulfide, selenide or nitride semiconductor material.

2. The apparatus of claim 1, wherein the source-side p-n hetero-junction is formed from the first semiconductor layer and a second semiconductor layer disposed between the first semiconductor layer and the source electrode, the second semiconductor layer including an oxide, sulfide, selenide, or nitride semiconductor material.

3. The apparatus of claim 1, wherein the p-n heterojunction includes a narrow bandgap material and a wide bandgap material, the first semiconductor layer including the narrow bandgap material.

4. The apparatus of claim 3, wherein the narrow bandgap material has a bandgap of 1.0 eV or less and the wide bandgap material has a bandgap of 3.0 eV or greater.

5. The apparatus of claim 1, wherein the p-n heterojunction is formed from a p-type oxide including one of undoped or doped SnO, $Ag_2O$, $Cu_2O$, or NiO and an n-type oxide including one of doped or undoped ZnO, $SnO_2$, $In_2O_3$, $TiO_2$ or IGZO-related materials.

6. The apparatus of claim 1, wherein the thickness of the first semiconductor layer is between about 2 nm and 40 nm.

7. The apparatus of claim 2, wherein the thickness of the second semiconductor layer is between about 2 nm and 100 nm.

8. The apparatus of claim 1, wherein the p-n hetero-junction includes a p-type semiconductor and an n-type semiconductor, which have carrier densities of at least $10^{18}/cm^3$.

9. The apparatus of claim 1, wherein the p-n hetero-junction includes a p-type semiconductor and an n-type semiconductor, which have carrier densities of at least $10^{19}/cm^3$.

10. The apparatus of claim 1, wherein the TFT is a p-channel TFT.

11. The apparatus of claim 1, wherein the TFT is an n-channel TFT.

12. The apparatus of claim 1, wherein the TFT exhibits tunneling across a potential barrier at the p-n hetero-junction.

13. The apparatus of claim 1, wherein the TFT has an off-current of no more than 10 picoamperes.

14. The apparatus of claim 1, wherein the TFT has an off-current of no more than 1 picoampere.

15. The apparatus of claim 1, wherein the first semiconductor layer is amorphous.

16. The apparatus of claim 1, wherein the first semiconductor layer is nanocrystalline.

17. The apparatus of claim 1, further comprising a flexible substrate on which the TFT is disposed.

18. The apparatus of claim 1, wherein the TFT is part of a complementary metal-oxide-semiconductor (CMOS) TFT device.

19. The apparatus of claim 1, wherein the TFT is a bottom gate TFT.

20. The apparatus of claim 1, wherein the TFT is a top gate TFT.

21. The apparatus of claim 1, further comprising:
a display;
a processor that is configured to communicate with the display, the processor being configured to process image data; and
a memory device that is configured to communicate with the processor.

22. The apparatus of claim 21, further comprising:
a driver circuit configured to send at least one signal to the display; and
a controller configured to send at least a portion of the image data to the driver circuit.

23. The apparatus of claim 22, wherein the driver circuit includes the TFT.

24. The apparatus of claim 21, further comprising:
an image source module configured to send the image data to the processor, wherein the image source module includes at least one of a receiver, transceiver, and transmitter.

25. The apparatus of claim 21, further comprising:
an input device configured to receive input data and to communicate the input data to the processor.

26. An apparatus, comprising:
a drain electrode;
a source electrode; and
semiconductor means to electrically connect the drain electrode and the source electrode, wherein the semiconductor means include a source-side p-n hetero-junction, and wherein the source side p-n hetero-junction is not on the drain region side of the apparatus.

27. The apparatus of claim 26, further comprising a gate electrode and a gate dielectric.

28. A method:
providing a substrate;
forming a first semiconductor layer on the substrate, wherein the first semiconductor layer includes an oxide, sulfide, selenide or nitride semiconductor material and wherein the first semiconductor layer includes a source region, a drain region and a channel region;
forming a second semiconductor layer on the source region of the first semiconductor layer to thereby form a source-side p-n heterojunction, wherein the source-side p-n heterojunction is not formed on the drain region; and
forming a source electrode on the second semiconductor layer and a drain electrode on the drain region of the first semiconductor layer.

29. The method of claim 28, wherein forming the first semiconductor layer comprises an atomic layer deposition (ALD) process.

30. The method of claim 28, further comprising forming a gate electrode and a gate dielectric, wherein the gate dielectric is between the first semiconductor layer and the gate electrode.

* * * * *